United States Patent
Khambati et al.

(10) Patent No.: US 11,215,000 B2
(45) Date of Patent: Jan. 4, 2022

(54) MAINFRAME DOOR WITH INTEGRATED EARTHQUAKE HARDWARE AND REVERSIBLE SWING

(71) Applicant: INTERNATIONAL BUSINESS MACHINES CORPORATION, Armonk, NY (US)

(72) Inventors: Suraush Khambati, Poughkeepsie, NY (US); Shawn Canfield, Poughkeepsie, NY (US); Budy Notohardjono, Poughkeepsie, NY (US); Richard M. Ecker, Poughkeepsie, NY (US); Steven C. McIntosh, Kingston, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 99 days.

(21) Appl. No.: 16/828,213

(22) Filed: Mar. 24, 2020

(65) Prior Publication Data
US 2021/0301574 A1    Sep. 30, 2021

(51) Int. Cl.
| | |
|---|---|
| E05D 15/58 | (2006.01) |
| E05D 7/12 | (2006.01) |
| H05K 5/02 | (2006.01) |
| E05D 11/00 | (2006.01) |
| E05D 3/02 | (2006.01) |

(52) U.S. Cl.
CPC ........... *E05D 15/581* (2013.01); *E05D 7/123* (2013.01); *H05K 5/0217* (2013.01); *E05D 3/02* (2013.01);
(Continued)

(58) Field of Classification Search
CPC ....... E05D 15/581; E05D 15/50; E05D 7/123; E05D 7/081; E05D 3/02; E05D 11/00;
(Continued)

(56) References Cited

U.S. PATENT DOCUMENTS

| | | | | |
|---|---|---|---|---|
| 5,606,773 A | * | 3/1997 | Shappell | E05F 1/123 16/298 |
| 5,983,590 A | | 11/1999 | Serban | |

(Continued)

FOREIGN PATENT DOCUMENTS

| | | |
|---|---|---|
| JP | 2010190025 A | 9/2010 |
| WO | 2019083474 A1 | 5/2019 |

OTHER PUBLICATIONS

Swanson, Eric James, "Seismic Spectra and Response Analysis for Raised Access Floor and Computer Equipment Systems Considering Vertical Ground Motions". ResearchGate.net. Mar. 2008. 24 pages.

(Continued)

*Primary Examiner* — William L Miller
(74) *Attorney, Agent, or Firm* — Cantor Colburn LLP; Tihon Poltavets (57) ABSTRACT

A mainframe door assembly for a frame is provided. The mainframe door assembly includes a door having opposed first and second sides and first and second mount assemblies. The first and second mount assemblies are configured to mount the first and second sides of the door to the frame, respectively, such that the door can occupy and move between an installed position and a loading position. In the installed position, the door is flush with the frame. In the loading position, the first mount assemblies support and the second mount assemblies permit a swinging of the door about the first side or the second mount assemblies support and the first mount assemblies permit a swinging of the door about the second side.

20 Claims, 5 Drawing Sheets

(52) U.S. Cl.
CPC ........ *E05D 11/00* (2013.01); *E05D 2007/128* (2013.01); *E05D 2015/586* (2013.01); *Y10T 16/52* (2015.01)

(58) Field of Classification Search
CPC ........ E05D 2007/128; E05D 2015/586; H05K 5/0217; H05K 7/1495; H02B 1/54; Y10T 16/52; Y10T 16/554; Y10T 16/547; Y10T 16/535
USPC .................. 16/221, 254, 366, 382; 312/322; 211/26; 454/184; 361/679.02; 49/149, 49/192, 193, 181, 176
See application file for complete search history.

(56) References Cited

U.S. PATENT DOCUMENTS

| | | |
|---|---|---|
| 6,425,488 B1 | 7/2002 | Notohardjono et al. |
| 6,454,646 B1 | 9/2002 | Helgenberg et al. |
| 7,874,433 B2 | 1/2011 | Levesque et al. |
| 8,220,881 B2* | 7/2012 | Keith ..................... H05K 7/186 312/324 |
| 8,659,905 B2 | 2/2014 | Knoop |
| 9,007,762 B2 | 4/2015 | Toya |
| 2003/0020379 A1* | 1/2003 | Larsen ................. E05D 15/502 312/218 |
| 2004/0132398 A1 | 7/2004 | Sharp et al. |
| 2007/0256447 A1* | 11/2007 | Leimkuehler ......... E05D 15/505 62/440 |
| 2012/0090869 A1 | 4/2012 | Bumeder et al. |
| 2015/0282349 A1 | 10/2015 | Mann et al. |
| 2019/0159358 A1 | 5/2019 | Chen et al. |
| 2020/0018012 A1* | 1/2020 | Renz ..................... E05B 65/001 |

OTHER PUBLICATIONS

Protect Networking Equipment."Seismic Cabinets". Retrived Mar. 1, 2020. https://www.cableorganizer.com/computer-cabinets/seismic-enclosures.html. 3p.

* cited by examiner

MAINFRAME DOOR WITH INTEGRATED EARTHQUAKE HARDWARE AND REVERSIBLE SWING

BACKGROUND

The present invention generally relates to mainframe doors and, more specifically, to a mainframe door with integrated earthquake-survivable hardware and reversible swing capability.

A rack or a rackmount is a standardized frame or enclosure that can be used for mounting multiple electronic equipment modules. The equipment modules can be components of computer servers, telecommunications equipment and networking hardware and audiovisual production and scientific equipment. Each rack has a base, a lid or ceiling, sidewalls that support the lid or ceiling over the base and front and/or back doors that can be opened or closed as needed to permit or prevent access to the multiple electronic equipment modules.

SUMMARY

Embodiments of the present invention are directed to a mainframe door assembly. A non-limiting example of the mainframe door assembly includes a door having opposed first and second sides and first and second mount assemblies. The first and second mount assemblies are configured to mount the first and second sides of the door to the frame, respectively, such that the door can occupy and move between an installed position and a loading position. In the installed position, the door is flush with the frame. In the loading position, the first mount assemblies support and the second mount assemblies permit a swinging of the door about the first side or the second mount assemblies support and the first mount assemblies permit a swinging of the door about the second side.

Embodiments of the present invention are directed to a mount assembly. A non-limiting example of the mount assembly includes a receiving unit and a door mount. The receiving unit includes receiving rails and a cap. The receiving rails define installed and loading sections of grooves. The cap is configured to assume closed and open conditions relative to the receiving rails. The door mount includes a body and first and second bearings. The first bearing is receivable in the grooves to enable the body to slide along the installed and loading sections. With the first bearing disposed in the loading section, the second bearing is configured to support a first rotation of the body with the cap assuming the closed condition and to permit a second rotation of the body with the cap assuming the open condition.

Embodiments of the present invention are directed to a mainframe door assembly operating method. A non-limiting example of the mainframe door assembly operating method includes clamping first and second mount assemblies to first and second sides of a frame, respectively, mounting first and second sides of a door to the first and second mount assemblies, respectively, and translating the door between installed and loading positions relative to the first and second mount assemblies. The installed position is characterized in that the door is flush with the frame. With the door in the loading position, the mainframe door assembly operating method further includes closing a cap of the first mount assembly, opening a cap of the second mount assembly and rotating the door about the first mount assembly or closing the cap of the second mount assembly, opening the cap of the first mount assembly and rotating the door about the second mount assembly.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagrams or the operations described therein without departing from the spirit of the invention. For instance, the actions can be performed in a differing order or actions can be added, deleted or modified. Also, the term "coupled" and variations thereof describe having a communications path between two elements and do not imply a direct connection between the elements with no intervening elements/connections between them. All of these variations are considered a part of the specification.

DETAILED DESCRIPTION

One or more embodiments of the present invention provide for a universal mainframe door that is equipped with clamp-on mounts so that the universal mainframe door can be universally fit to all mainframes of a given width per EIA standards (e.g., 19 inch racks). The universal mainframe door allows for an integration of earthquake-survivable hardware with a mainframe door and is capable of reversible swing in that the universal mainframe door can be opened from either the left or the right side.

Mainframes, in earthquake prone regions, require additional reinforcement hardware to keep their side-to-side, bow and twist motion under a certain limit. For instance, top-hat displacement, which is a measure for the side-to-side stiffness of a frame, is used as a reference metric in many earthquake regulatory tests in which the additional reinforcement hardware (i.e., a frame) has a maximum displacement requirement for passing. It has been seen that the natural frequencies of vibration of a frame, as measured by sine sweep in testing and modal analysis in simulation, are an indication of the overall stiffness of the frame. The higher the frequency, the stiffer the frame and hence the better the frame scores on things like earthquake regulatory tests.

Existing frame hardware tends to incorporate customized, bolt-on pieces that are optimized for maximum strength and air flow for thermal considerations, which are unique on case-by-case bases, but not necessarily for earthquake survivability or survivability from other similar events.

As will be described below, the universal mainframe door increases an overall stiffness of a frame and provides an improvement over conventional hardware. Also, since the universal mainframe door is universal, it can be applied to any frame without the need for special, separate hardware, without a need to form holes at specific locations and without the need to remove hardware for servicing. The universal mainframe door includes ball bearings that support each corner of the door, receiving slides to ensure a flush fit, caps to prevent a fall-out of the universal mainframe door and locking mechanisms on all of the corners once the universal mainframe door is within a frame.

Figure 1:
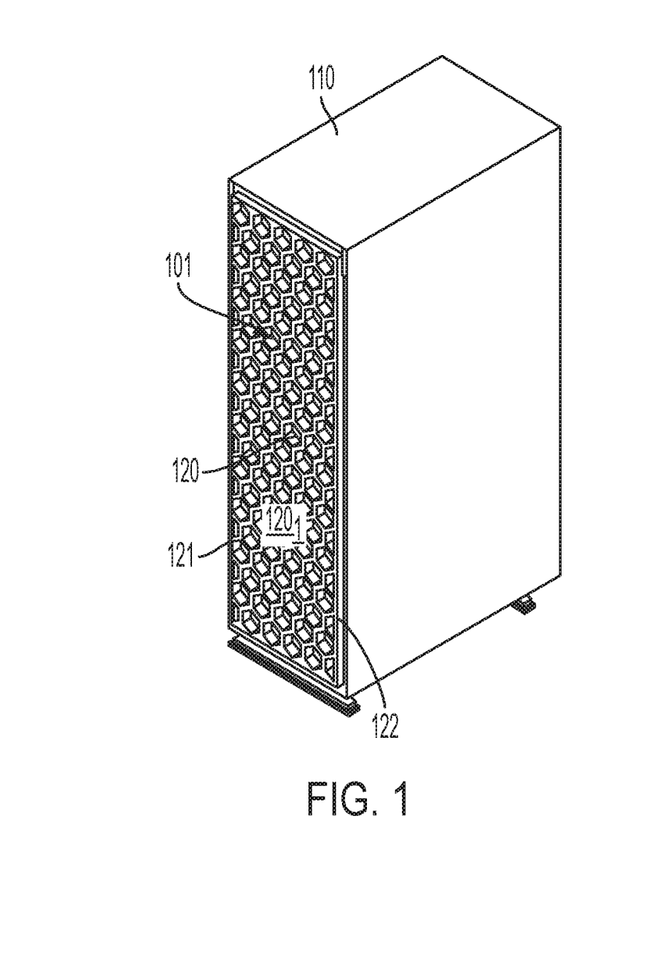
FIG. 1 is a perspective view of a mainframe door assembly in accordance with one or more embodiments of the present invention.
Figure 2:
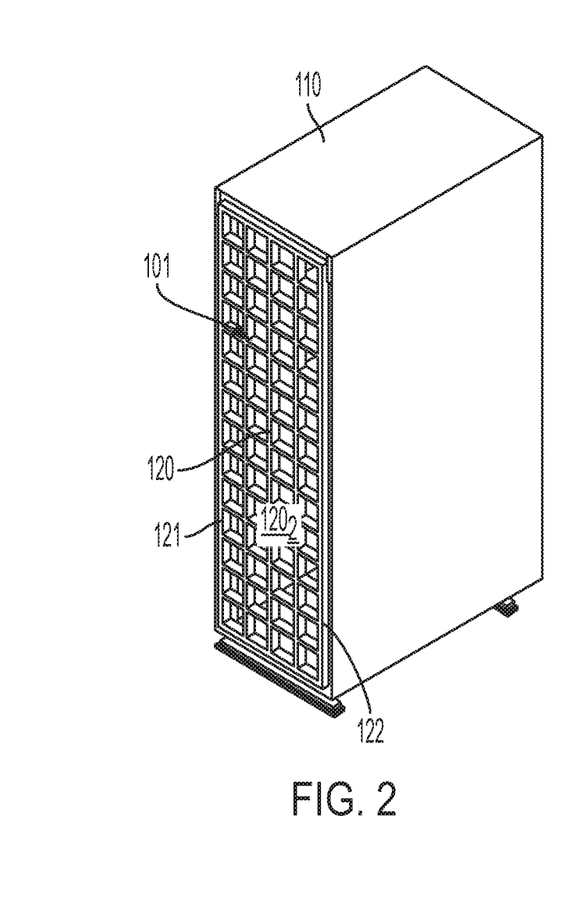
FIG. 2 is a perspective view of a mainframe door assembly in accordance with one or more embodiments of the present invention

Turning now to FIGS. 1 and 2, a mainframe door assembly 101 is provided for use with a frame 110. The mainframe door assembly 101 includes a door 120 having a first side 121 and a second side 122. The frame 110 can take various forms and can have various sizes. In accordance with one or more embodiments of the present invention, the frame 110 can be compliant with Electronic Industries Alliance (EIA) standards and can have a width of about 19 inches. The door 120 can include at least one of a honeycomb brace patterned body $120_1$ (see FIG. 1) and a square brace patterned body $120_2$ (see FIG. 2), as examples, though it is to be understood that other constructions and configurations of the door 120 are possible. In each case, the door 120 can be disposed flush within the frame 110, as will be described below, and can provide additional resilience and survivability to the frame 110 for earthquake resilience, in particular (the honeycomb brace patterned body $120_1$ of FIG. 1 offers a first resonance with the frame 110 at 9.1 Hz and the square brace patterned body $120_2$ of FIG. 2 offers a first resonance with the frame 110 at 7.8 Hz).

Figure 3A:
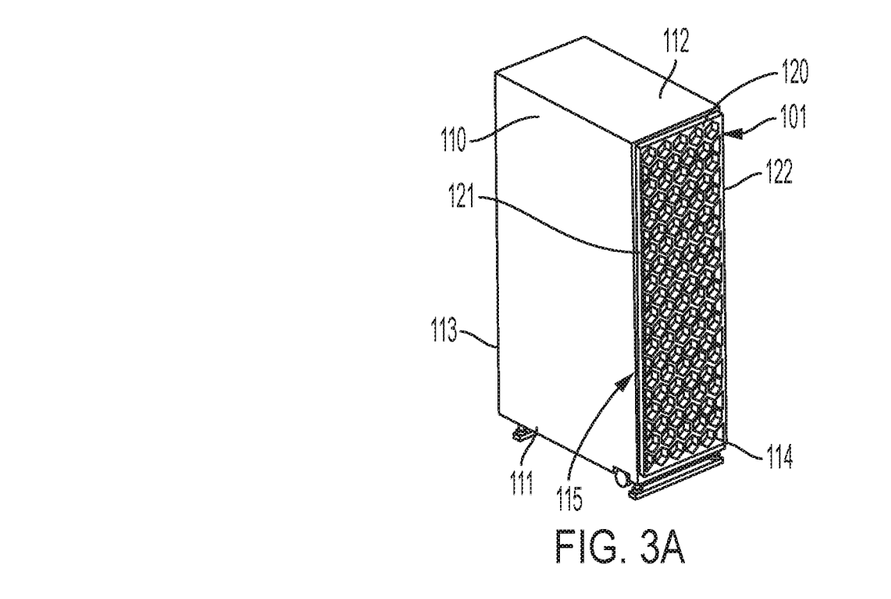
FIG. 3A is a sectional perspective view of the mainframe door assembly of FIG. 1 in accordance with one or more embodiments of the present invention.
Figure 3B:
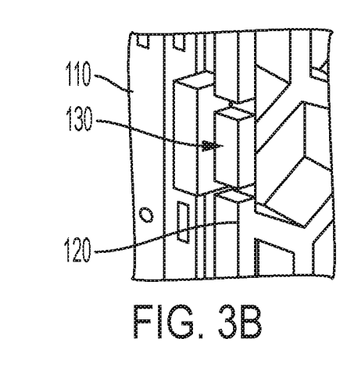
FIG. 3B is an enlarged perspective view of a mount assembly of the mainframe door assembly of FIG. 3A in accordance with one or more embodiments of the present invention.
Figure 3C:
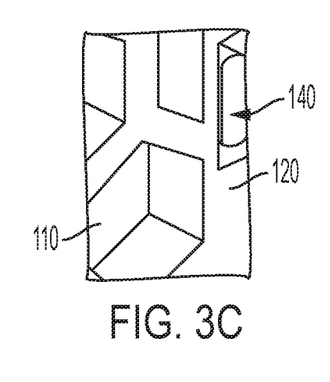
FIG. 3C is an enlarged perspective view of a mount assembly of the mainframe door assembly of FIG. 3A in accordance with one or more embodiments of the present invention.

With reference to FIGS. 3A, 3B and 3C, the frame 110 includes a base 111, a ceiling 112 and sidewalls 113 and 114 that support the ceiling 112 above the base 111. The base 111, the ceiling 112 and the sidewalls 113 and 114 define an interior in which various types of computing devices can be stored and an opening 115. The sidewall 113 forms a first side of the frame 110 that corresponds with the first side 121 of the door 120 and the sidewall 114 forms a second side of the frame 110 that corresponds with the second side 122 of the door 120. The opening 115 provides for access to the interior. The door 120 is mounted in the opening 115.

With continued reference to FIGS. 3A, 3B and 3C, the mainframe door assembly 101 further includes a first mount assembly 130 and a second mount assembly 140. The first mount assembly 130 can be provided as one or plural first mount assemblies 130 and can mount the first side 121 of the door 120 to the sidewall 113 at the first side of the frame 110. The second mount assembly 140 can be provided as one or plural second mount assemblies 140 and can mount the second side 122 of the door 120 to the sidewall 114 at the second side of the frame 110. Where the first mount assembly 130 is provided as plural first mount assemblies 130 and where the second mount assembly 140 is provided as plural second mount assemblies 140, the plural first mount assemblies 130 and the plural second mount assemblies 140 can be disposed at or near corners of the first and second sides 121 and 122 of the door 120, respectively.

The following description will refer to a first mount assembly 130 and to plural first mount assemblies 130 or simply first mount assemblies 130 interchangeably. Similarly, the following description will refer to a second mount assembly 140 and to plural second mount assemblies 140 or simply second mount assemblies 140 interchangeably. This is done for purposes of clarity and brevity.

Figure 8:
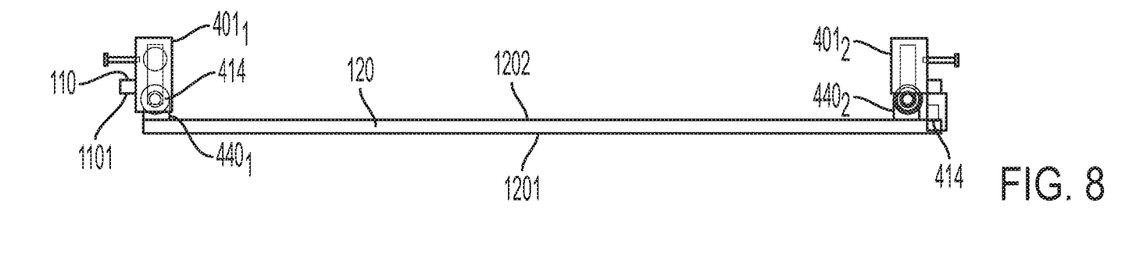
FIG. 8 is a top-down view of a door disposed in a loading position relative to one closed door mount assembly and one open door mount assembly in accordance with one or more embodiments of the present invention.

The first mount assembly 130 and the second mount assembly 140 are each configured similarly in order to mount the first and second sides 121 and 122 of the door 120 to the frame 110, respectively, such that the door 120 can occupy and move between an installed position (see FIG. 6) and a loading position (see FIG. 8). The installed position is characterized in that the door 120 is flush with the frame 110 or, more particularly, in that an exterior surface 1201 of the door 120 is flush with a corresponding exterior surface 1101 of the frame 110 (see FIG. 6). The loading position is characterized in that the door 120 protrudes from the frame 110 or, more particularly, in that the exterior surface 1201 of the door 120 protrudes from the corresponding exterior surface 1101 of the frame 110 (see FIG. 8).

In accordance with one or more embodiments of the present invention, the first mount assembly 130 and the second mount assembly 140 are each configured similarly in order to mount the first and second sides 121 and 122 of the door 120 to the frame 110, respectively, such that the door 120 can translate between the installed position and the loading position.

With the door 120 disposed in the installed position, the first mount assemblies 130 and the second mount assemblies 140 are each configured similarly to secure the door 120 in the installed position.

With the door 120 disposed in the loading position, the first mount assemblies 130 are configured to support a swinging of the door 120 in a first rotational direction about the first side 121 while remaining in a closed condition and the second mount assemblies 140 can be opened to thereby permit the swinging of the door 1120 in the first rotational direction about the first side 121. Conversely, with the door 120 disposed in the loading position, the second mount assemblies 140 are configured to support a swinging of the door 120 in a second rotational direction about the second side 122 while remaining in a closed condition and the first mount assemblies 130 can be opened to thereby permit the swinging of the door 120 in the second rotational direction about the second side 122.

Figure 4:
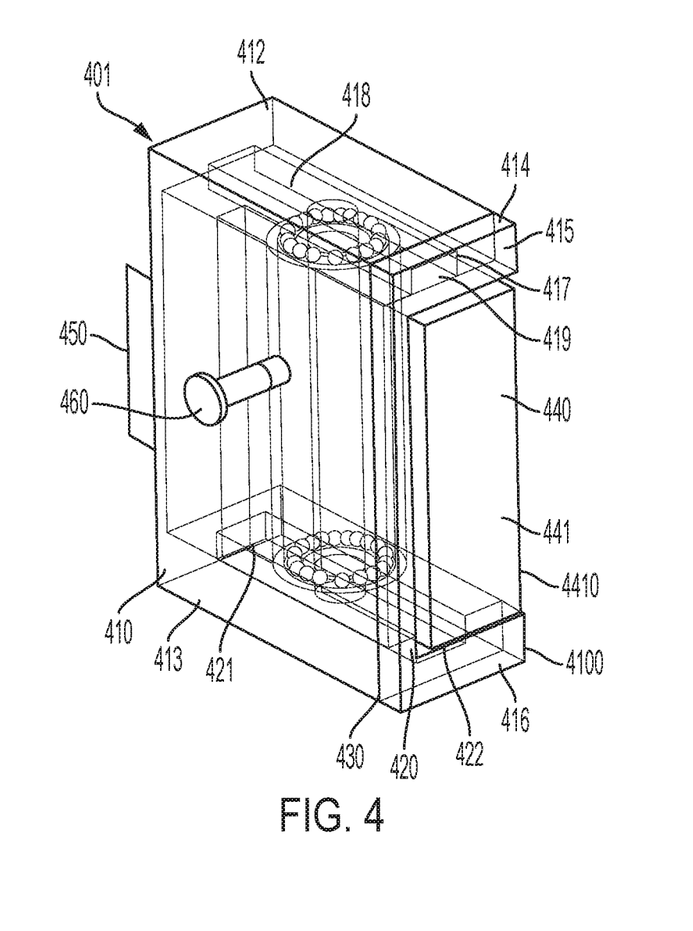
FIG. 4 is a perspective view of a mount assembly of the mainframe door assembly of FIG. 3A with a door mount in an installed position in accordance with one or more embodiments of the present invention.
Figure 5:
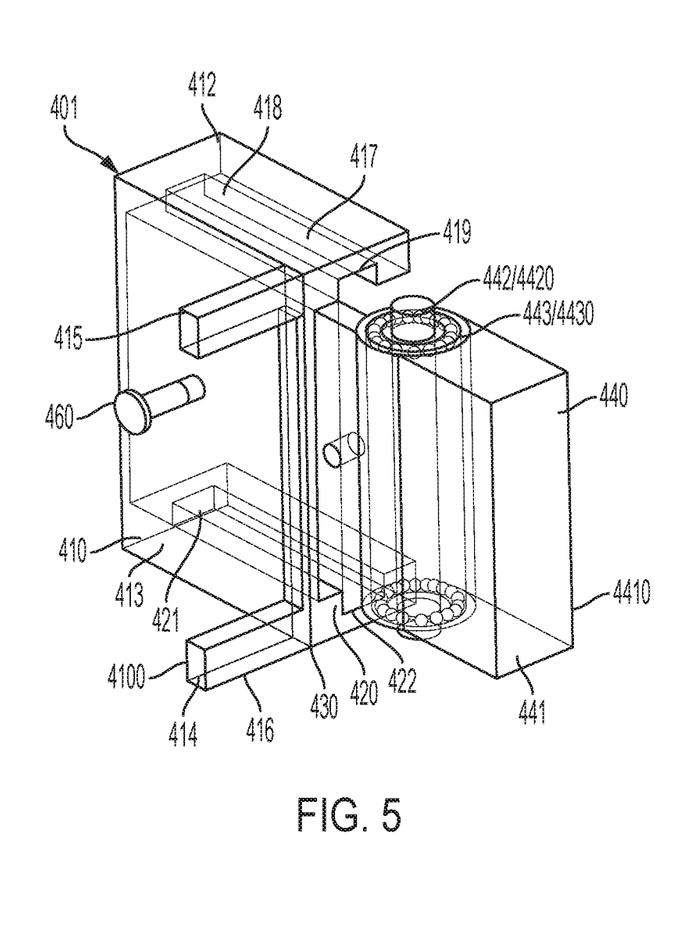
FIG. 5 is a perspective view of a mount assembly of the mainframe door assembly of FIG. 3A with a door mount in an installed position in accordance with one or more embodiments of the present invention.

With reference to FIGS. 4 and 5, a mount assembly 401 is provided for use as either the first mount assembly 130 or the second mount assembly 140. The mount assembly 401 includes a receiving unit 410, a hinge 430 and a door mount 440. The mount assembly 401 can further include a clamp 450 (see FIG. 5) and a fastener 460. The clamp 450 can be configured to clamp the receiving unit 410 to the frame 110. The fastener 460 can be provided as a pin and is disposable to extend through openings of the receiving unit 410 and the door mount 440 to thus secure the door mount 440 in installed sections 418 and 421 to be described below in correspondence with the door 120 being disposed in the installed position.

The receiving unit 410 includes a base 411, an upper receiving rail 412 that extends from the base 411, a lower receiving rail 413 that extends from the base 411, a cap 414. The cap 414 includes an upper section 415 that corresponds to the upper receiving rail 412 and a lower section 416 that corresponds to the lower receiving rail 413. The upper receiving rail 412 defines a groove 417 with installed section 418 extending along the upper receiving rail 412 and a loading section 419 terminating at the upper section 415 of the cap 414. The lower receiving rail 413 defines a groove 420 with installed section 421 extending along the lower receiving rail 413 and a loading section 422 terminating at the lower section 416 of the cap 414. The installed sections 418 and 421 terminate at respective interior ends of the upper receiving rail 412 and the lower receiving rail 413 remote from the cap 414.

The cap 414 is coupled to the base 411 by the hinge 430 about which the cap 414 is rotatable. The cap 414 is thus configured to assume a closed position (see FIG. 4) and an open position (see FIG. 5) relative to the upper and lower receiving rails 412 and 413. In the closed position, the cap 414 abuts with the upper receiving rail 412 and the lower receiving rail 413 such that the grooves 417 and 420 are fully defined and closed. In the open position, the cap 414 is rotated away from the upper and lower receiving rails 412 and 413 whereby the installed sections 418 and 421 are open and unobstructed.

As shown in FIG. 5, the door mount 440 includes a body 441, a first bearing 442 and a second bearing 443. The body 441 is attachable to an interior surface 1202 of the door 120 (see FIG. 6) Thus, a rotation of the body 441 in a first direction or a second direction can correspond to corresponding rotations or swings of the door 120. The first bearing 442 is receivable in the grooves 417 and 420 to enable the body 441 to slide along the installed sections 418 and 421 and along the loading sections 419 and 422. With the first bearing 442 disposed in the installed sections 418 and 421, an exterior surface 4410 of the body 441 sits flush with a corresponding exterior surface 4100 of the receiving unit 410. With the first bearing 442 disposed in the loading sections 419 and 422, the second bearing 443 is configured to support a first rotation of the body 441 with the cap 414 assuming the closed condition (i.e., a swinging of the door 120 in a first direction) and to permit a second rotation of the body 441 with the cap 414 assuming the open condition (i.e., a swinging of the door 120 in a second direction).

In accordance with one or more embodiments of the present invention, the first bearing 442 can include or be provided as a slide bearing 4420 and the second bearing 443 can include or be provided as a rotation bearing 4430.

With reference to FIGS. 6-9, an operation of the mainframe door assembly 101 is provided.

Figure 6:
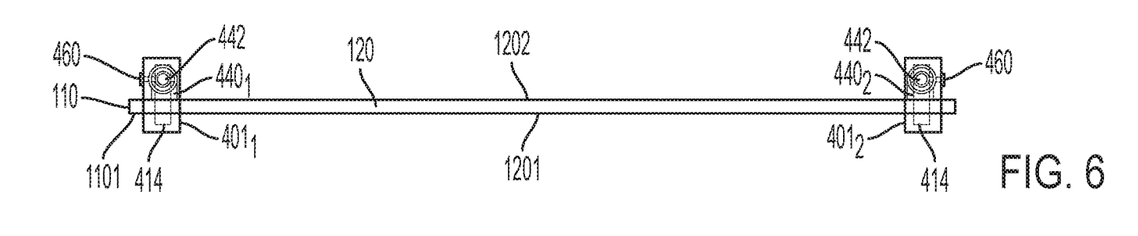
FIG. 6 is a top-down view of a door disposed in an installed position relative to door mount assemblies in accordance with one or more embodiments of the present invention.

FIG. 6 shows that the door 120 is disposed in the installed position. Here, the exterior surface 1201 of the door 120 is flush with the exterior surface 1101 of the frame 110 and the first bearings 442 of each of the door mounts $440_1$ and $440_2$ are disposed at or near the terminals of the installed sections 418 and 421 (see FIGS. 4 and 5) of each of the mount assemblies $401_1$ and $401_2$. The caps 414 of each of the mount assemblies $401_1$ and $401_2$ are occupying the closed condition and the fasteners 460 are disposed to secure the door mounts 440 so that the door 120 cannot be translated toward the loading position.

Figure 7:
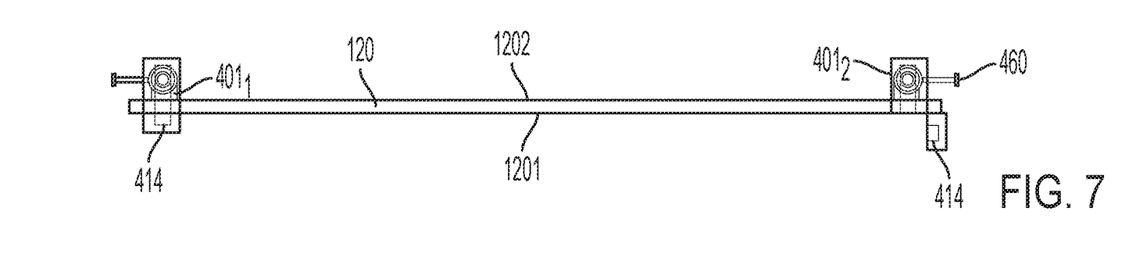
FIG. 7 is a top-down view of a door disposed in an installed position relative to one closed door mount assembly and one open door mount assembly in accordance with one or more embodiments of the present invention.

FIG. 7 shows that the fasteners 460 have been removed and that the cap 414 of the mount assembly $401_2$ is occupying the open condition while the cap 414 of the mount assembly 4011 continues to occupy the closed condition. The removal of the fasteners 460 permits a translation of the door 120 toward the loading position. The opening of the cap 414 of the mount assembly $401_2$ permits a swinging open of the door 120 as described below.

FIG. 8 shows that the door 120 has arrived at the loading position. Here, the door mount $440_2$ is free to rotate away from the mount assembly $401_2$ owing to the opening of the cap 414 of the mount assembly $401_2$ whereas the door mount $440_1$ is constrained from rotating away from the mount assembly $401_1$ owing to the closure of the cap 414 of the mount assembly $401_1$.

Figure 9:
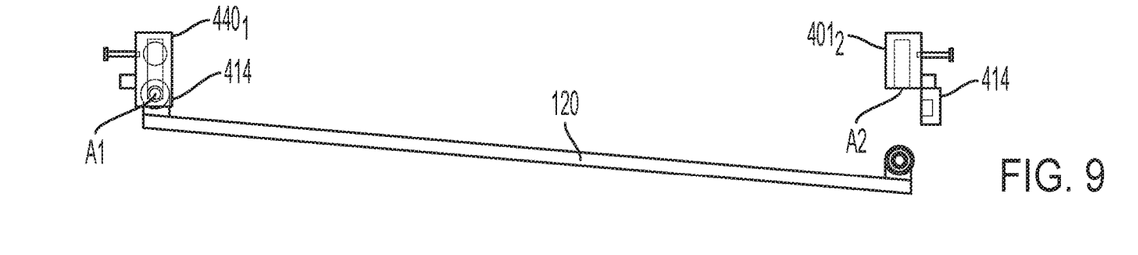
FIG. 9 is a top-down view of a door having been rotated relative to one closed door mount assembly and one open door mount assembly in accordance with one or more embodiments of the present invention.

FIG. 9 shows that the door 120 has swung open in a first rotational direction about rotational axis A1 that is defined through the mount assembly $401_1$ and which is remote from the mount assembly $401_2$. It follows that if the opened and closed caps 414 were switched, FIG. 9 would show that the door 120 has swung open in a second rotational direction about rotational axis A2 that is defined through the mount assembly $401_2$ and which is remote from the mount assembly $401_1$.

Figure 10:
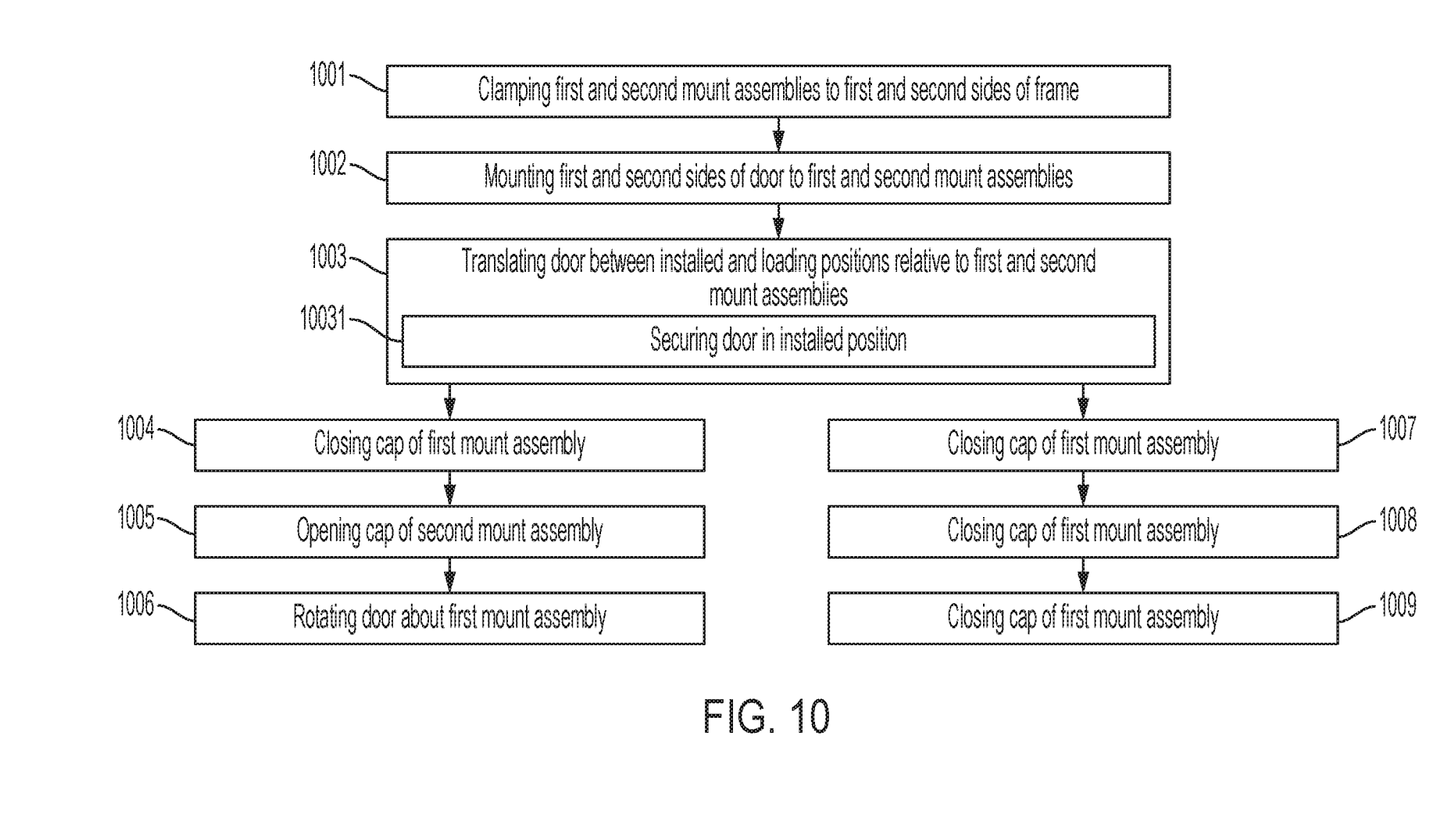
FIG. 10 is a flow diagram illustrating a mainframe door assembly operating method in accordance with one or more embodiments of the present invention.

With reference to FIG. 10, mainframe door assembly operating method is provided. The mainframe door assembly method includes clamping first and second mount assemblies to first and second sides of a frame, respectively (1001) and mounting first and second sides of a door to the first and second mount assemblies, respectively (1002). The method can further include translating the door between installed and loading positions relative to the first and second mount assemblies (1003) where the installed position is characterized in that the door is flush with the frame or, more particularly, in that an exterior surface of the door is flush with a corresponding exterior surface of the frame. With the door in the loading position, the method can also include closing a cap of the first mount assembly (1004), opening a cap of the second mount assembly (1005) and rotating the door about the first mount assembly (1006). Conversely, with the door in the loading position, the method can also include closing the cap of the second mount assembly (1007), opening the cap of the first mount assembly (1008) and rotating the door about the second mount assembly (1009).

In accordance with one or more embodiments of the present invention, the translating of the door between installed and loading positions relative to the first and second mount assemblies of operation 1003 can include securing the door in the installed position (10031).

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

One or more of the methods described herein can be implemented with any or a combination of the following technologies, which are each well known in the art: a discrete logic circuit(s) having logic gates for implementing logic functions upon data signals, an application specific integrated circuit (ASIC) having appropriate combinational logic gates, a programmable gate array(s) (PGA), a field programmable gate array (FPGA), etc.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A mainframe door assembly for a frame, the mainframe door assembly comprising:
   a door having a body with opposed first and second sides;
   first and second mount assemblies configured to mount the first and second sides of the door to the frame, respectively, such that the door occupies and moves between:
      an installed position, at which the door is flush with the frame at the first and second sides of the door, and
      a loading position, which is arrived at by the door translating away from the installed position and toward the loading position in a direction which is normal to a plane of the body, and at which the first mount assemblies support and the second mount assemblies permit a swinging of the door about the first side or at which the second mount assemblies support and the first mount assemblies permit a swinging of the door about the second side.

2. The mainframe door assembly according to claim 1, wherein:
   the frame comprises a base, a ceiling and sidewalls supporting the ceiling above the base, and
   the base, the ceiling and the sidewalls define an opening in which the door is mounted.

3. The mainframe door assembly according to claim 1, wherein the door comprises a honeycomb brace patterned body.

4. The mainframe door assembly according to claim 1, wherein the door comprises a square brace patterned body.

5. The mainframe door assembly according to claim 1, wherein:
   the first mount assembly comprises multiple first mount assemblies configured to mount the first side of the door to a corresponding first side the frame, and
   the second mount assembly comprises multiple second mount assemblies configured to mount the second side of the door to a corresponding second side the frame.

6. The mainframe door assembly according to claim 1, wherein the first and second mount assemblies are configured such that the door is translatable between the installed position and the loading position in the direction which is normal to the plane of the body and between the loading position and the installed position in a reverse direction opposing the direction.

7. The mainframe door assembly according to claim 1, wherein the installed position is characterized in that an exterior surface of the door is flush with a corresponding exterior surface of the frame.

8. The mainframe door assembly according to claim 1, wherein the first and second mount assemblies are configured to secure the door in the installed position.

9. The mainframe door assembly according to claim 1, wherein, with the door in the loading position, the second mount assemblies are openable to permit the swinging of the door about the first side and the first mount assemblies are openable to permit the swinging of the door about the second side.

10. A mount assembly, comprising:
    a receiving unit comprising receiving rails defining installed and loading sections of grooves and a cap configured to assume closed and open conditions relative to the receiving rails; and
    a door mount comprising:
       a body;
       a first bearing receivable in the grooves to enable the body to slide along the installed and loading sections; and
       a second bearing which, with the first bearing disposed in the loading section, is configured to support a first rotation of the body with the cap assuming the closed condition and to permit a second rotation of the body with the cap assuming the open condition.

11. The mount assembly according to claim 10, further comprising a clamp configured to clamp the receiving unit to a frame.

12. The mount assembly according to claim 10, further comprising a fastener disposable to extend through openings of the receiving unit and the door mount to secure the door mount in the installed section.

13. The mount assembly according to claim 10, wherein the receiving unit comprises upper and lower receiving rails and the cap comprises upper and lower sections.

14. The mount assembly according to claim 10, wherein the cap is coupled to the receiving unit by a hinge about which the cap is rotatable to assume the closed and open conditions.

15. The mount assembly according to claim 10, wherein an exterior surface of the body of the door mount sits flush with a corresponding exterior surface of the receiving unit with the first bearing disposed in the installed section.

16. The mount assembly according to claim 10, wherein the first bearing comprises a slide bearing and the second bearing comprises a rotation bearing.

17. The mount assembly according to claim 10, wherein the first rotation of the body is about a first rotational axis defined through the loading section and the second rotation of the body is about a second rotational axis which is remote from the receiving unit and the door mount.

18. A mainframe door assembly operating method, comprising:
    clamping first and second mount assemblies to first and second sides of a frame, respectively;
    mounting first and second sides of a door to the first and second mount assemblies, respectively;
    translating the door between installed and loading positions relative to the first and second mount assemblies, the installed position being characterized in that the door is flush with the frame; and
    with the door in the loading position:
       closing a cap of the first mount assembly, opening a cap of the second mount assembly and rotating the door about the first mount assembly, or
       closing the cap of the second mount assembly, opening the cap of the first mount assembly and rotating the door about the second mount assembly.

19. The method according to claim 18, wherein the installed position is characterized in that an exterior surface of the door is flush with a corresponding exterior surface of the frame.

20. The method according to claim 18, further comprising securing the door in the installed position.

* * * * *